United States Patent [19]
Ofenloch et al.

[11] Patent Number: 5,761,231
[45] Date of Patent: Jun. 2, 1998

[54] METHOD AND CIRCUIT ARRANGEMENT FOR REGULATING THE LUMINOUS POWER OF A LASER DIODE

[75] Inventors: Thomas Philipp Jakob Ofenloch, Rüsselsheim; Klaus Hofmann, Langen, both of Germany

[73] Assignee: Linotype-Hell AG, Kiel, Germany

[21] Appl. No.: 722,186

[22] PCT Filed: Jan. 30, 1996

[86] PCT No.: PCT/DE96/00122

§ 371 Date: Dec. 4, 1996

§ 102(e) Date: Dec. 4, 1996

[87] PCT Pub. No.: WO96/25781

PCT Pub. Date: Aug. 22, 1996

[30] Foreign Application Priority Data

Feb. 14, 1995 [DE] Germany .................. 195 24 712.5

[51] Int. Cl.[6] .................................................. H01S 3/00
[52] U.S. Cl. .................................................. 372/38; 372/31
[58] Field of Search .................................. 372/38, 31

[56] References Cited

U.S. PATENT DOCUMENTS

| | | | |
|---|---|---|---|
| 4,710,779 | 12/1987 | Funaki et al. | |
| 4,995,045 | 2/1991 | Burley et al. | 372/31 |
| 5,222,072 | 6/1993 | Oku | 372/31 |
| 5,402,432 | 3/1995 | Chou | 372/31 |
| 5,530,712 | 6/1996 | Solija et al. | 372/31 |
| 5,579,328 | 11/1996 | Habel et al. | 372/31 |

FOREIGN PATENT DOCUMENTS

0 218 449  9/1986  European Pat. Off.

OTHER PUBLICATIONS

Patent Abstract of Japan—JP 201 5686–19 Jan. 1990.

Semiconductor Laser vol. 12, No. 273 (E–639) 3120 Jul. 29, 1988.

Semiconductor Laser Driving Device, vol. 12, No. 9 (E–572 2856 Jan. 12, 1988.

Semiconductor Laser Driving Device, vol. 12, No. 9, E–572 2856 Jan. 12, 1988.

*Primary Examiner*—Leon Scott, Jr.
*Attorney, Agent, or Firm*—Hill & Simpson

[57] ABSTRACT

A process and circuit arrangement for regulating the luminous power of a laser diode in an optoelectronic point-by-point or line recording device for recording information on a recording material. A deviation is determined by comparing a luminous power set value to a measured luminous power real value. A fast regulator generates a regulating current based on the deviation. A slow regulator with storage capabilities generates a working point regulating current that determines the working point on a laser diode characteristic curve and that is added to the regulating current to provide the driving current of the laser diode. The luminous power set value and the slow regulator are used during the switching-on periods of the laser diodes at the beginning of the recording periods and during preliminary periods that precede the recording periods. The working point regulating current corrects the working point of the laser diode during the preliminary periods and is kept constant during the subsequent recording periods. Oscillations of the luminous power that may occur during the recording periods are only regulated by the fast regulator.

20 Claims, 2 Drawing Sheets

METHOD AND CIRCUIT ARRANGEMENT FOR REGULATING THE LUMINOUS POWER OF A LASER DIODE

BACKGROUND OF THE INVENTION

The invention refers to the field of electronic reproduction technology and is directed to a method and to a circuit arrangement for regulating the luminous power of a laser diode in the optoelectronic recording element of a recording device, also referred to as a recorder or exposer, for the point-by-point and line-by-line recording of information on a recording material.

Such a recording element is essentially composed of a light source for generating a brightness-modulated light beam, of a drive circuit charged with an image signal for the light source, and of an objective arranged on the optical axis of the light source for focussing the light beam onto the recording material. The image signal contains the information to be recorded. The light beam modulated in brightness by the image signal undertakes the point-by-point and line-by-line exposure of the recording material, for example a film. The light power emitted by the laser diode is defined by a driver current that is generated in a drive circuit dependent on the image signal.

For exposing two-level black/white information (line information), the laser diode operates in switched mode wherein the light output by the laser diode is switched on and off by the two-level driver current or, respectively, by the two-level image signal (image data). In order to achieve a high recording quality, the level of the emitted light must be as constant as possible in the on-time intervals of the laser diode. Based on its very nature, a laser diode does not meet the demand for a constant light level in the on-time intervals since the emitted light power of a laser diode is temperature-dependent.

A method for regulating the luminous power of a laser diode is disclosed, for example, by GB Letters Patent 21 01 841. The light emitted by the laser diode is measured with a light detector and the measured signal generated by the light detector is forwarded as an actual luminous power value to a control circuit for the driver current of the laser diode via a feedback branch. In the control circuit, the actual luminous power value is compared to a predetermined rated luminous power value, and the corresponding repetitive errors are stored in a sample-and-hold circuit with the assistance of a sample clock sequence, being stored line-by-line in sample intervals that lie in front of the recording intervals required for the line-by-line recording. The stored repetitive errors are then supplied as correction values to a regulator that correspondingly regulates the driver current for the laser diode in the sample intervals.

In the known method, the temperature-dependent luminous power of the laser diode is only regulated in the sample intervals preceding the recording intervals but not in the recording intervals themselves. Disadvantageously, brief-duration fluctuations of the luminous power during the exposure within the recording intervals can therefore not be corrected, so that an optimum recording quality is not achieved. Another disadvantage is comprised therein that the regulator must generate the entire driver current when the laser diode is switched on, a high control gain being required for this. Given a high control gain, however, there is the risk of hunting, so that fluctuations in luminous intensity that influence the recording quality can occur.

A method is also already known for regulating the luminous power of a laser diode wherein the driver current for the laser diode is composed of the regulator current generated in the regulator and of a variable bias. The bias shifts the operating point of the laser diode into the proximity of the current threshold at which the laser effect begins. The regulation then ensues in the linear characteristics range of the laser diode. When a constant bias is impressed on the laser diode, the luminous power output by the laser diode does not drop to zero with the laser diode shut off due to the operating point set by the bias since a light emission already occurs below the current threshold. This effect, which particularly occurs in laser diodes that emit visible laser light, has the disadvantage that sensitive recording material is pre-exposed in an undesirable way or, respectively, is exposed with a gray fog. It is also considered disadvantageous that the required bias is temperature-dependent.

SUMMARY OF THE INVENTION

An object of the invention is to improve on an arrangement for regulating the luminous power of a laser diode such that a fast and qualitatively high-grade recording is achieved.

According to the invention, an arrangement is provided for regulating luminous power of a laser diode in an optoelectronic recording element for point-by-point and line-by-line recording of information on a recording material. A rated value generator prescribes a rated luminous power value. A light detector optically coupled to the laser diode measures the actual luminous power value. A subtractor connected to the light detector forms a repetitive error from the rated luminous power value and the actual luminous power value. A first regulator connected to the subtractor generates the regulator current dependent on the repetitive error for driving the laser diode. The second regulator connected to the first regulator generates an operating point current for correcting an operating point of the laser diode on a characteristic curve of the laser diode. A first electronic switch controllable with a control signal is connected to the rated value generator and to the subtractor. A second electronic switch is connected to the second regulator and is controllable with the control signal. An adder has inputs connected to the first regulator and to the second electronic switch and an output in communication with the laser diode for acquiring a driver current for the laser diode by addition of the regulator current and the operating point current.

The invention is explained in greater detail below with reference to FIGS. 1 and 2.

DESCRIPTION OF THE PREFERRED EMBODIMENTS

Figure 1:
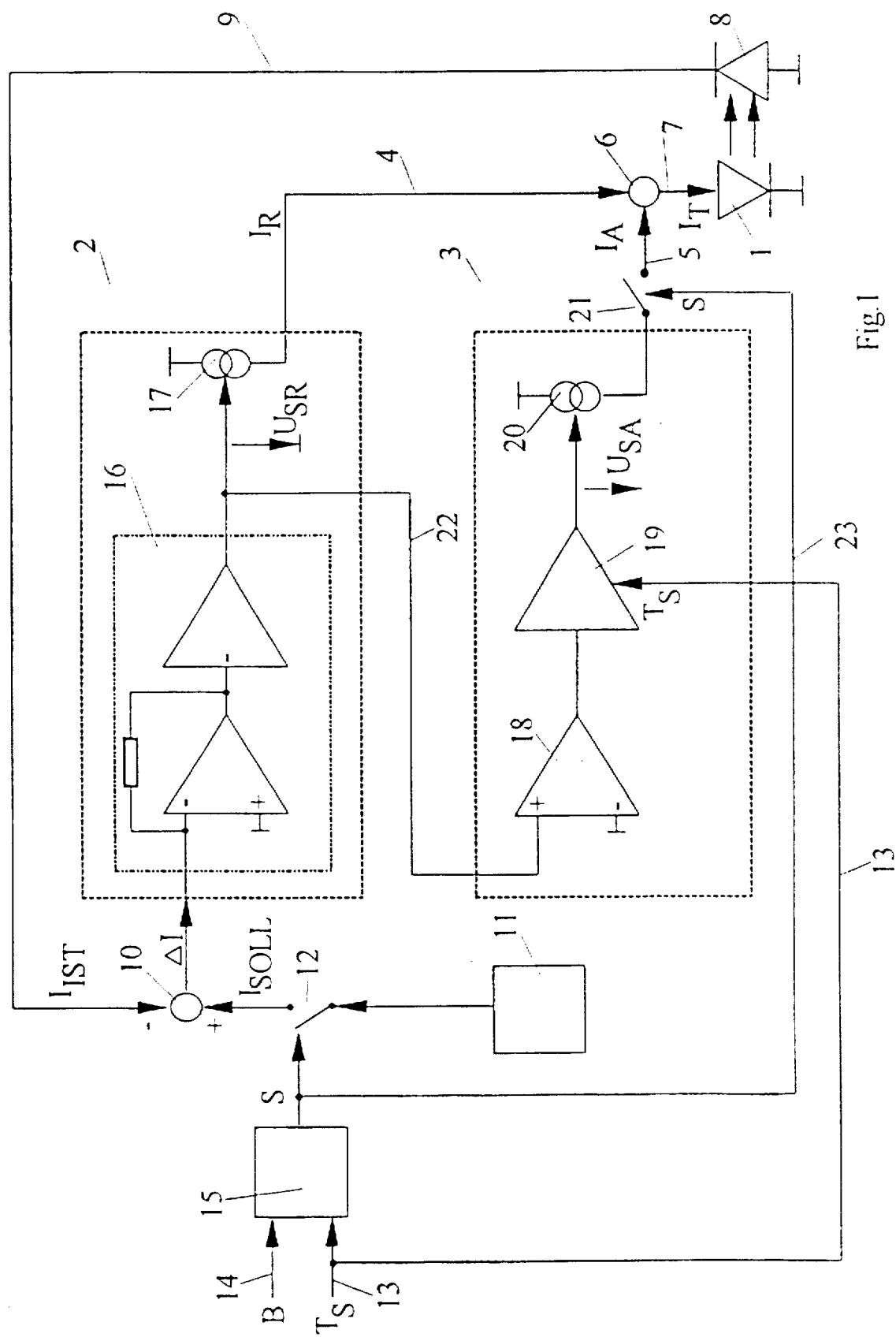
FIG. 1 is a schematic block circuit diagram of a circuit arrangement for regulating the luminous power output by a laser diode.

FIG. 1 shows a schematic block circuit diagram of a circuit arrangement for regulating the luminous power of a laser diode 1 operating in switched mode. The laser diode 1 serves as modulatable light source in an optoelectronic recording element of a recording device (not shown in detail) for the point-by-point and line-by-line recording of information on a recording material.

The circuit arrangement is essentially composed of a first regulator 2 for generating a regulator current $I_R$ proportional to an identified repetitive error $\Delta I$ and of a second regulator 3 for generating an operating point current $I_A$ that is likewise dependent on the identified repetitive error $\Delta I$. The regulator current $I_R$ and the operating point current $I_A$ on lines 4,5 are added in an adder 6 to obtain the driver current $I_T=I_R+I_A$ for the laser diode 1, also referred to as diode current. The driver current $I_T$ is supplied to the laser diode 1 via a line 7. The luminous power P output by the laser diode 1 is determined by the driver current $I_T$ according to the laser diode characteristic $P=f(I_T)$ that reflects the relationship between the driver current $I_T$ and the emitted luminous power P. Since the emitted luminous power P is temperature-dependent and can thus fluctuate, a corresponding regulation of the luminous power of the laser diode (1) occurs via the supplied driver current $I_T$. The operating point current $I_A$ generated in the second regulator (3) determines the operating point, i.e. the turn-on point of the laser diode, on the laser diode characteristic $P=f(I_T)$ such that the regulation of the luminous power is executed in the linear range.

The luminous power P output by the laser diode (1) is measured with a light detector in the form of a monitor diode (8). The monitor diode (8) optoelectronically converts a part of the light output by the laser diode (1) into an actual value current $I_{IST}$ that is employed as the actual luminous power value for the regulation. The monitor diode can be integrated in a housing together with the laser diode and can be optically directly coupled to the laser diode. The monitor diode, however, can also be arranged separated from the laser diode. In this case, the optical coupling between monitor diode and laser diode occurs, for example, with a reflector that reflects a part of the light of the laser diode onto the monitor diode.

The actual value current $I_{ST}$ is forwarded via a feedback branch 9 from the monitor diode 8 to a subtractor in which the current difference $\Delta I$ between a rated value current $I_{SOLL}$ representing a rated luminous power value and the actual value current $I_{IST}$ is formed as repetitive error. The rated value current $I_{SOLL}$ is generated in a rated value generator 11 and is supplied to the subtractor 10 via a first electronic switch 12 that is symbolized in the illustration as a mechanical switch.

The first electronic switch 12 is actuated by a control signal S that is formed from a sample clock sequence $T_S$ on a line 13 and from an image signal B on a line 14. The clocks or pulses of the sample clock sequence $T_S$ define sample intervals and the spacings between the clocks define hold intervals for a sample-and-hold element to be described later. The two-level image signal (B) representing image data carries the information to be recorded in the individual recording intervals (lines). The one level of the image signal B signals "turn the laser diode on" and the other level signals "turn the laser diode off". Sample clock sequence $T_S$ and image signal are synchronized such with one another that the hold intervals of the sample clock sequence $T_S$ coincide with the recording intervals and such that a recording interval follows every sample interval.

The sample clock sequence $T_S$ and the image signal B are subjected to a logical OR operation in an OR element 15. The output signal of the OR element 15 is the control signal S for the first electronic switch 12. The control signal S actuates the first electronic switch 12 in such a way that this is closed only in the same intervals of the sample clock sequence $T_S$ and in the time intervals "switch the laser diode on" defined in the recording intervals by the image signal B, as a result whereof a corresponding regulation of the luminous power of the laser diode 1 occurs only when the first electronic switch 12 is closed.

The first regulator 2 is essentially composed of a current/voltage converter 16 with a high gain factor $K_1$ and of a first voltage-controlled current source 17. The current/voltage converter 16 converts the positive or negative repetitive error or, respectively, the difference current $\Delta I$ into a corresponding positive or negative control voltage $U_{SR}=K_1*\Delta I$ for the first current source 17. The first current source 17 generates the positive or negative regulator current $I_R$ that is proportional to the positive or negative control voltage $U_{SR}$. The first regulator 2 has a high bandwidth and can therefore be referred to as a "fast regulator".

The second regulator 3 is composed essentially of a differential amplifier 18 having a gain factor $K_2$ that is likewise high, of a following sample-and-hold element 19 and of a second voltage-controlled current source 20. The control voltage $U_{SR}$ for the first current source 17 is conducted to the differential amplifier 18 via a line 22. The differential amplifier 18 converts the positive or negative repetitive error $\Delta I$ into what is always a positive control voltage $U_{SA}=K_1*K_2*\Delta I$ for the second current source 20 that is respectively intermediately stored in the sample-and-hold element 19 in the sample intervals of the sample clock sequence $T_S$. The sample-and-hold element 19 is clocked by the sample clock sequence $T_S$ on the line 13. The second current source 20 supplies an operating point current $I_A$ that is proportional to the positive control voltage $U_{SA}$, is always positive and that is conducted via a second electronic switch 21 to the adder 6. The second electronic switch 21 is likewise actuated by the control signal S. The second regulator 3 with memory behavior has a small bandwidth and can therefore be referred to as "slow regulator".

Figure 2:
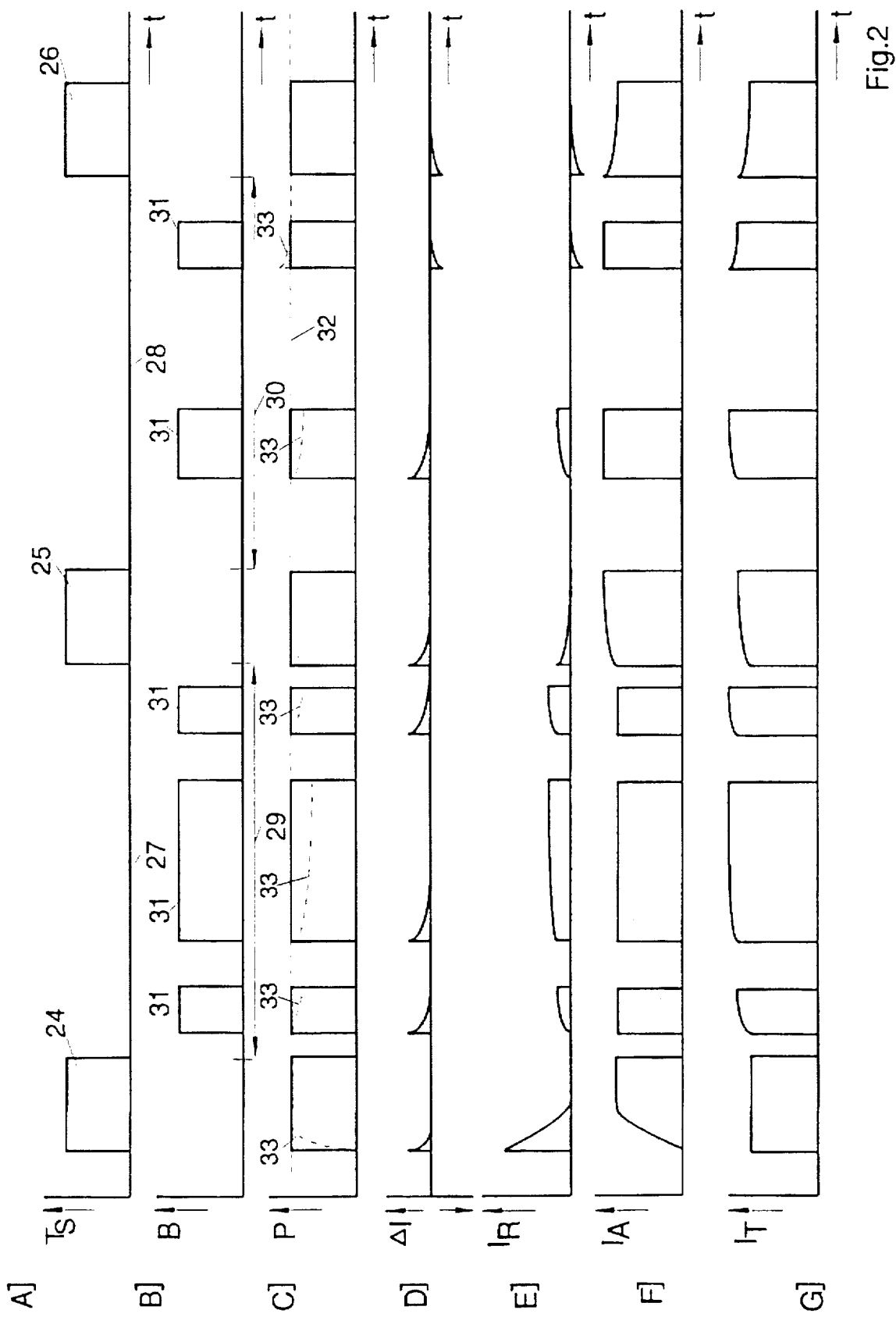
FIG. 2 are time diagrams for illustrating the signal curves in the circuit arrangement.

FIG. 2 shows time diagrams for illustrating the signal curves in the circuit arrangement of FIG. 1. The time diagram A) illustrates the curve of the sample dock sequence $T_S$ with three sample intervals 24,25,26 and two intervening hold intervals 27,28, and the time diagram B shows the curve of the image signal B in the recording intervals 29,30 that coincide with the hold intervals 27,28. In the recording intervals 29,30, the image signal B supplies the information to be recorded in the form of square-wave pulses 31.

The time diagram C) shows the curve of the luminous power P output by the laser diode 1. A broken line 32 identifies the rated luminous power P of the laser diode 1. A broken line 33 identifies the emitted luminous power P given a traditional regulation with a regulator that has a gain factor 1. The square-wave curves of the luminous power P derive in the inventive regulation with the fast regulator 2 that has a gain factor $K_1=>>1$.

The time diagram D) shows the curve of the repetitive error $\Delta I$. Given a gain factor $K_1=>>1$ of the fast regulator 2, the repetitive error $\Delta I$ needed for generating the regulator current $I_R$ practically approaches zero. In order to make the repetitive error in time diagram D) visible, it was shown exagerrated.

The time diagram E) shows the curve of the regulator current $I_R$ generated in the fast regulator 2, and the time diagram F) shows the curve of the operating point current $I_A$ acquired in the slow regulator 3. The time diagram G) shows the curve of the driver current $I_T=I_R+I_A$ for the laser diode 1.

The inventive method for regulating the luminous power of the laser diode (1) operating in switched mode is explained in greater detail with reference to the circuit arrangement shown in FIG. 1 and to the time signal curves shown schematically in FIG. 2.

The electronic switches 12,21 are closed for the duration of the sample intervals 24,25,26 of the sampling clock sequence $T_S$ and for the duration of the square-wave pulses 31 of the image signal B. Respectively at the beginning of a sample interval 24,25,26, the momentary repetitive error $\Delta I$ is determined between the predetermined rated luminous power value P and the measured, actual luminous power value P. Within the sample intervals (24,25,26), the fast regulator (2) generates a positive or negative regulator current $I_R$ that corresponds in amount and direction to the identified repetitive error $\Delta I$ and that approaches zero within the sample intervals (24,25,26), and the slow regulator (3) generates a corresponding operating point current $I_A$ that rises or drops within the appertaining sample interval (24, 25,26) dependent on whether the emitted luminous power P lies below or above the desired rated luminous power value. The sum of regulator current $I_R$ and operating point current $I_A$ yields the driver current $I_T$ for the laser diode (1).

No later than at the respective end of a sample interval (24,25,26), the regulator current is $I_R=0$ and the operating point current $I_A$ has assumed the value required for setting the correct operating point on the laser diode characteristic $P=f(I_T)$, this value being held constant for the duration of the respectively immediately following hold interval (27,28) or, respectively, recording interval (29,30) because of the memory behavior of the slow regulator (3). A potentially required operating point correction is only undertaken again in the next sample interval (24,25,26) with the assistance of the fast regulator (2) and of the slow regulator (3). The operating point correction is dependent on the temperature behavior of the laser diode (1) in the preceding recording interval (29,30), whereby the temperature behavior is in turn determined by the curve of the image signal B (ratio of on time to off time) in the corresponding recording interval 29,30. Given a corresponding dimensioning of the slow regulator 2, the setting values are not initially reached until the end of the respective sample intervals 24,25,26 but are already reached significantly earlier. Given a sample interval of 5 μs, this is he case, for example, after 5 μs.

Whereas the slow regulator 3, as set forth above, does not operate in the recording intervals, temperature-conditioned fluctuations of the luminous power in the individual on-time intervals of the laser diode 1 are leveled by the fast regulator 2 by itself, so that unavoidable fluctuations in luminous power can also be advantageously corrected given a very short on-time of the laser diode 1 of, for example, 20 ns. Given a corresponding dimensioning of the fast regulator 2, leveling times of, for example 10 ns can be achieved.

Given the example shown in FIG. 2, the emitted luminous power P (time diagram C) lies below the rated value 31 in the first sample interval 24. A positive repetitive error $\Delta I$ (time diagram D) derives in this case. Accordingly, the regulator current $I_R$ (time diagram E) drops to zero within the first sample interval 24, and the operating point current $I_A$ (time diagram F) rises to the value required for setting the correct operating point. As a result thereof, the luminous power P (time diagram C) is corrected by the driver current $I_T=I_R+I_A$ (time diagram G) to the rated value 31 within the first sample interval 24.

Three square-wave pulses 31 of the image signal B (time diagram B) that lie in close proximity to one another occur, for example, in the first recording interval 29, as a result whereof relatively long on times and short off times derive. Without regulation, let the luminous power P (time diagram C) drop during the respective on times due to a temperature elevation of the laser diode (1), this being respectively indicated by the broken line 33. These drops in the luminous power P are compensated by the fast regulator (2) in that it generates a rising regulator current $I_R$ (time diagram E) that is superimposed on the constant operating point current $I_A$ (time diagram F) in order to obtain the corrected driver current $I_T$ (time diagram G).

Both regulators 2,3 are again activated in the second sample interval (25), and the operating point of the laser diode 1 is corrected because of the drop in luminous power previously compensated in the first recording interval, being correct by a corresponding rise of the operating point current $I_A$ (time diagram F) or, respectively, of the driver current $I_T$ (time diagram G).

For example, two square-wave pulses 31 of the image signal B (time diagram B) that are relatively short and lie farther apart lie in the following, second recording interval 30, so that relatively short on times and long off times derive. Without regulation, let the luminous power P drop during the first on time and have an elevated value at the beginning of the second on time due to the long on time preceding it (time diagram C), this being indicated by the broken lines 33. These changes in the luminous power P within the second recording interval 30 due to the temperature response of the laser diode are again compensated only by the fast regulator 2 in that it generates a positive regulator current $I_R$ for compensation of the drop in luminous power and generates a negative regulator current $I_R$ for compensating the elevation of the luminous power (time diagram E). The regulator currents $I_R$ are again added to the constant operating point current $I_A$ (time diagram F) in order to obtain the corrected driver current $I_T$.

Both regulators 2,3 are again activated in the third sample interval (26), and, due to the rise in luminous power previously compensated in the second recording interval (30), the operating point of the laser diode (1) is corrected by a corresponding drop in the operating point current $I_A$ (time diagram F) or, respectively, in the driver current $I_T$ (time diagram G).

The above-described method has the following significant advantages.

Since the second regulator (3) produces the full current $I_A$ or, respectively, $I_T$ for setting the operating point of the laser diode in the individual recording intervals 29,30, the first regulator (2) need only respectively generate the relatively small difference current $I_R$ that is required for the correction of fluctuations in luminous power due to the temperature response of the laser diode. As a result thereof, a fast, dynamic compensation of the luminous power fluctuations is advantageously achieved with high control precision. A relatively small control gain can also be employed in the regulation, the risk of an instability of the control circuit being thus minimized. What is also assured by the regulation principle is that the operating point always lies in the linear region of the laser diode characteristic, as a result whereof the control system is linear. The problems known from non-linear control systems are thereby eliminated.

As a result thereof that the rated luminous power value and the operating point current $I_A$ are cut in and out with electronic switches, the leading and trailing edges of the driver current $I_T$ and, thus, the emitted luminous power are determined in a preferred way only by the switch properties of the electronic switches and not by the bandwidth of the control circuit. A high data rate of the digital image signal can therefore by achieved.

Since no bias source is required, the emitted luminous power in the off state of the laser diode is exactly zero, so that sensitive recording material is not disturbingly pre-exposed or, respectively, exposed with a gray fog.

As a result of said advantages of the inventive regulation of the luminous power of the laser diode, a fast and qualitatively high-grade recording is achieved overall.

Although various minor changes and modifications might be proposed by those skilled in the art, it will be understood that our wish is to include within the claims of the patent warranted hereon all such changes and modifications as reasonably come within our contribution to the art.

We claim as our invention:

1. A method for regulating luminous power of a laser diode in an optoelectronic recording element for point-by-point and line-by-line recording of information on a recording material, comprising the steps of:

switching the laser diode on and off by an image signal that carries the information to be recorded;

predetermining a rated luminous power value and measuring the luminous power output by the laser diode as an actual luminous power value;

determining a repetitive error by forming a difference between the rated luminous power value and the actual luminous power value;

employing a regulator current output from a first regulator for driving the laser diode which is dependent in terms of amount and operational sign on the repetitive error input to the first regulator;

providing a second regulator for generating an operating point current for determining an operating point on a characteristic curve of the laser diode, the laser diode characteristic defining the luminous power output by the laser diode as a function of a driver current supplied to the diode;

adding the regulator current and the operating point current in order to obtain the driver current for the laser diode;

switching on the predetermined rated luminous power value and the operating point current generated in the second regulator during an on-time interval of the laser diode within recording intervals corresponding to the lines and during pre-intervals lying before the respective recording intervals;

for correcting the operating point within the pre-intervals determining the respective repetitive error and varying the operating point current dependent on the identified repetitive error until the repetitive error and the regulator current are zero;

retaining the operating point current determined at the repetitive error of zero respectively for the duration of the recording intervals following the pre-intervals; and compensating fluctuations of the luminous power output by the laser diode which occur in the recording intervals by only the regulator current generated in the first regulator.

2. The method according to claim 1, including the steps of:

forming the first regulator with a current/voltage converter with a high gain factor $K_1$, and a following voltage-controlled current source for generating the regulator current; and converting the repetitive error with the current voltage converter with a first control voltage $U_{SR}$ for the current source according to the equation $U_{SR}=K_1*\Delta I$ where $\Delta I$ is said repetitive error.

3. The method according to claim 1 wherein the first regulator has a large bandwidth.

4. The method according to claim 2 including the steps of:

forming the second regulator of a differential amplifier with a high gain factor $K_1$, of a following storage unit, and of a voltage-controlled, second current source for generating the operating point current;

utilizing the differential amplifier to convert the repetitive error into a second control voltage $U_{SA}$ for the second current source according to the equation $U_{SA}=K_1*K_2*\Delta I$; and storing the second control voltage in the storage unit.

5. The method according to claim 4 wherein the storage unit of the second regulator is designed as a sample-and-hold element that is controlled by a sample clock sequence.

6. The method according to claim 5 wherein the pre-intervals are determined by a clock pulse of the sample clock sequence and the recording intervals are determined by spacings of the clock pulses.

7. The method according to claim 1 wherein the second regulator has a small bandwidth.

8. The method according to claim 1 wherein the predetermined rated luminous power value and the operating point current are switched on and off with electronic switches actuated by a control signal.

9. The method according to claim 8 wherein the control signal for the electronic switches is formed by an OR operation of the image signal and a sample clock sequence.

10. The method according to claim 1 wherein a maximum operating point current generated in the second regulator is determined such that the operating point lies in a linear region of the laser diode characteristic.

11. The method according to claim 1 wherein the luminous power output by the laser diode is measured with a light detector optically coupled to the laser diode.

12. The method according to claim 1 wherein the operating point correction in the pre-interval respectively occurs dependent on temperature behavior of the laser diode in the preceding recording intervals.

13. A circuit arrangement for regulating luminous power of a laser diode in an optoelectronic recording element for point-by-pint and line-by-line recording of information on a recording material, comprising:

a rated value generator for prescribing a rated luminous power value;

a light detector optically coupled to the laser diode for measuring the actual luminous power value;

a subtractor connected to the light detector for forming a repetitive error from the rated luminous power value and the actual luminous power value;

a first regulator connected to the subtractor for generating a regulator current dependent on the repetitive error for driving the laser diode;

a second regulator connected to the first regulator for generating an operating point current for correcting an operating point of the laser diode on a characteristic curve of the laser diode;

a first electronic switch controllable with a control signal and connected to the rated value generator and to the subtractor;

a second electronic switch connected to the second regulator and controllable with the control signal; and an adder having inputs connected to the first regulator and to the second electronic switch and an output in communication with the laser diode for acquiring a driver current for the laser diode by addition of the regulator current and the operating point current.

14. The circuit arrangement according to claim 13 wherein the first regulator is formed of a current/voltage converter with a high gain factor and of a following, voltage-controlled current source for generating the regulator current.

15. The circuit arrangement according to claim 13 wherein the first regulator comprises a large bandwidth.

16. The circuit arrangement according to claim 13 wherein the second regulator is formed of a differential amplifier with a high gain factor of a following storage, and of a voltage-controlled, second current source for generating the operating point current.

17. The circuit arrangement according to claim 13 wherein the second regulator has a small bandwidth.

18. The circuit arrangement according to claim 13 wherein the storage of the second regulator is designed as a sample-and-hold element that is controlled by a sample clock sequence.

19. The circuit arrangement according to claim 18 wherein an OR element is connected to the first and to the second electronic switches, and is provided for generating the control signal by an OR operation of the sample clock sequence with an image signal carrying the information to be recorded.

20. A circuit arrangement for regulating luminous power of a laser diode in an optoelectronic recording element for point-by-point and line-by-line recording of information on a recording material, comprising:

a rated value generator for prescribing a rated luminous power value;

a light detector optically coupled to the laser diode for measuring the actual luminous power value;

a subtractor connected to the light detector for forming a repetitive error from the rated luminous power value and the actual luminous power value;

a first regulator connected to an output of the subtractor for generating a regulator current dependent on the repetitive error for driving the laser diode;

a second regulator connected to an output of the first regulator for generating an operating point current for correcting an operating point of the laser diode on a characteristic curve of the laser diode;

a first electronic switch for connecting the rated value generator and to an output of the subtractor;

a second electronic switch for connecting an output of the second regulator to a first input of an adder; and the adder having a second input connected to an output of the first regulator and an output for providing a driver current for the laser diode.

* * * * *